United States Patent
Ho et al.

(10) Patent No.: US 6,972,964 B2
(45) Date of Patent: *Dec. 6, 2005

(54) MODULE BOARD HAVING EMBEDDED CHIPS AND COMPONENTS AND METHOD OF FORMING THE SAME

(75) Inventors: Kwun-Yao Ho, Taipei (TW); Moriss Kung, Taipei (TW)

(73) Assignee: Via Technologies Inc., Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/042,638

(22) Filed: Jan. 25, 2005

(65) Prior Publication Data

US 2005/0122698 A1 Jun. 9, 2005

Related U.S. Application Data

(63) Continuation-in-part of application No. 10/431,458, filed on May 8, 2003, now Pat. No. 6,865,089.

(30) Foreign Application Priority Data

Jun. 27, 2002 (TW) .............................. 91114186 A

(51) Int. Cl.[7] ............................................. H05K 1/18
(52) U.S. Cl. ...................... 361/761; 361/763; 361/783
(58) Field of Search ................ 361/760–765, 361/782–783, 792–795; 174/255–262, 268–261; 257/675–680

(56) References Cited

U.S. PATENT DOCUMENTS

| | | | |
|---|---|---|---|
| 4,931,853 A | 6/1990 | Ohuchi et al. | 357/74 |
| 5,200,810 A * | 4/1993 | Wojnarowski et al. | 361/750 |
| 5,306,670 A | 4/1994 | Mowatt et al. | 437/209 |
| 5,422,513 A | 6/1995 | Marcinkiewicz et al. | 257/668 |
| 5,497,033 A * | 3/1996 | Fillion et al. | 257/723 |
| 5,745,984 A | 5/1998 | Cole, Jr. et al. | 29/834 |
| 5,998,859 A | 12/1999 | Griswold et al. | 257/679 |
| 6,377,464 B1 * | 4/2002 | Hashemi et al. | 361/760 |
| 6,555,906 B2 | 4/2003 | Towle et al. | 257/723 |
| 6,639,324 B1 * | 10/2003 | Chien | 257/778 |

* cited by examiner

*Primary Examiner*—Kamand Cuneo
*Assistant Examiner*—Tuan Dinh
(74) *Attorney, Agent, or Firm*—Thomas, Kayden, Horstemeyer & Risley

(57) ABSTRACT

A module board has embedded chips and components. A substrate has at least one large cavity and at least one small cavity, in which the large cavity passes through the substrate and a passive component is set in the small cavity. A heat-dissipation sheet is set at the bottom of the substrate. A first adhesion layer bonds the bottom of the substrate to the heat-dissipation sheet. At least one IC chip is fixed in the large cavity of the substrate by a second adhesion layer. A dielectric filling layer covers the entire surface of the module board and fills all gaps, in which the dielectric filling layer has a plurality of micro vias to expose partial areas of the IC chip, the passive component and the substrate. At least one wiring pattern layer is formed on the dielectric filling layer and provide electrical connection among the IC chip, the passive component, and the substrate.

23 Claims, 16 Drawing Sheets

MODULE BOARD HAVING EMBEDDED CHIPS AND COMPONENTS AND METHOD OF FORMING THE SAME

This application is a continuation-in-part of application Ser. No. 10/431,458 filed on May 8, 2003, now U.S. Pat. No. 6,865,089.

BACKGROUND OF THE INVENTION

1. Field of the Invention

The present invention relates to a module board and a method of forming the same. More particularly, the present invention relates to an integrated module board, with a structure similar to a cavity-down plastic ball grid array (CD-PBGA) substrate or a substrate having various cavities, in which all kinds of chips and components are embedded or mounted onto the module board.

2. Description of the Related Art

Electrical packaging, including attachment of IC chips, electrical connections of circuits, sealing, assembly of a circuit board, system integration and product packing, integrates IC chips with essential components to achieve electric communication, circuit-signal communication, heat-dissipation path, loading capability and protection. In general, electrical packaging technology is classified into four fabricating levels. In the first level, electrical connections of circuits are completed on a substrate on which IC chips are fixed, and then the substrate is encapsulated to become a packaging body. In the second level, the packaging body is integrated to a circuit board with other electrical components. In the third level, several of the circuit boards are fabricated on a main board to serve as a sub-system board. In the fourth level, several of the sub-system boards are combined to complete an electrical product.

As the integration grade of IC chips on the substrate increases, the pin number of IC input and IC output does also, resulting in a requirement to develop a packaging substrate having a high-density arrangement of IC chips. For example, with a cavity-down plastic ball grid array (CD-PBGA) substrate, the IC chip is fixed in a cavity of the substrate, and is then electrically connected to bonding fingers on the substrate by an Au-wiring bonding process, and the CD-PBGA substrate is then placed on a circuit board in which the IC chip positioned in the cavity is allowed to attach to the circuit board. Furthermore, a heat-dissipation device is installed over the CD-PBGA substrate, and passive components are placed on the circuit board by an additional assembly process.

This process encounters the following problems. First, the packaging of IC chips, the assembly of passive components' surface mount technology (SMT) must proceed individually, resulting in a lengthy procedure, low yield, and high product costs. Second, since the assembly of passive components and the SMT cannot be integrated at the same packaging level, it is impossible to reduce the product to a desired thickness. Third, in order to achieve heat dissipation, a heat sink/fan and an electromagnetic interference (EMI) shielding sheet must be further provided on the main board to enhance the electrical performance, also causing increased costs. Fourth, since the IC chips, the passive components, and the heat-dissipation device cannot all be integrated on the same substrate during the same packaging level, the circuit route of the product layout is extremely long, interfering with electrical properties.

Thus, a method of integrating the IC chips, the passive components, and the heat-dissipation device on a module board during the same packaging level to solve the aforementioned problems is called for.

SUMMARY OF THE INVENTION

The present invention provides an integrated module board, with structure similar to a cavity-down plastic ball grid array (CD-PBGA) substrate or a substrate having various cavities, constituting a substrate having cavities and a heat-dissipation sheet adhering to each other. Also, a plurality of passive components (or integrated passive module) and IC chips are formed in the cavities of the substrate. Moreover, a multi-layered interconnection process can directly proceed on the module board to provide electrical connection to other circuit boards in a cavity down manner.

A module board having embedded chips and components comprises a substrate having at least one large cavity and at least one small cavity, in which the large cavity passes through the substrate and a passive component is set in the small cavity. A heat-dissipation sheet is set at the bottom of the substrate. A first adhesion layer bonds the bottom of the substrate to the heat-dissipation sheet. At least one IC chip is fixed in the large cavity of the substrate by a second adhesion layer. A dielectric filling layer covers the entire surface of the module board and fills all gaps, in which the dielectric filling layer has a plurality of micro vias to expose partial areas of the IC chip, the passive component and the substrate. At least one wiring pattern is formed on the dielectric filling layer and electrically connects to the IC chip, the passive component (or integrated passive module) and the substrate.

Accordingly, it is a principal object of the invention to simplify the assembly process.

It is another object of the invention to decrease the process costs.

Yet another object of the invention is to make the electrical test more convenient.

It is a further object of the invention to control the thickness of the module board to decrease the dimensions of the product.

Still another object of the invention is to improve the electrical property of the product.

Another object of the invention is to increase the product yield.

These and other objects of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE INVENTION

The present invention provides a module board, similar to a cavity-down plastic ball grid array (CD-PBGA) substrate or a substrate having various cavities, constituting a substrate having cavities and a heat-dissipation sheet adhering to each other. A plurality of passive components (or integrated passive module) and IC chips are formed in the cavities of the substrate. A multi-layered interconnection process can directly proceed on the module board to provide electrical connection to other circuit boards in a cavity down manner. In accordance with the number of the IC chips and variations in the packaging process, the module board may serve as a module component, a multi-chip module (MCM) substrate or a main board to be applied to every fabricating level in the electrical packaging technology.

FIGS. 1 to 9 are sectional diagrams showing a method of forming the module board according to the present invention.

Figure 1:
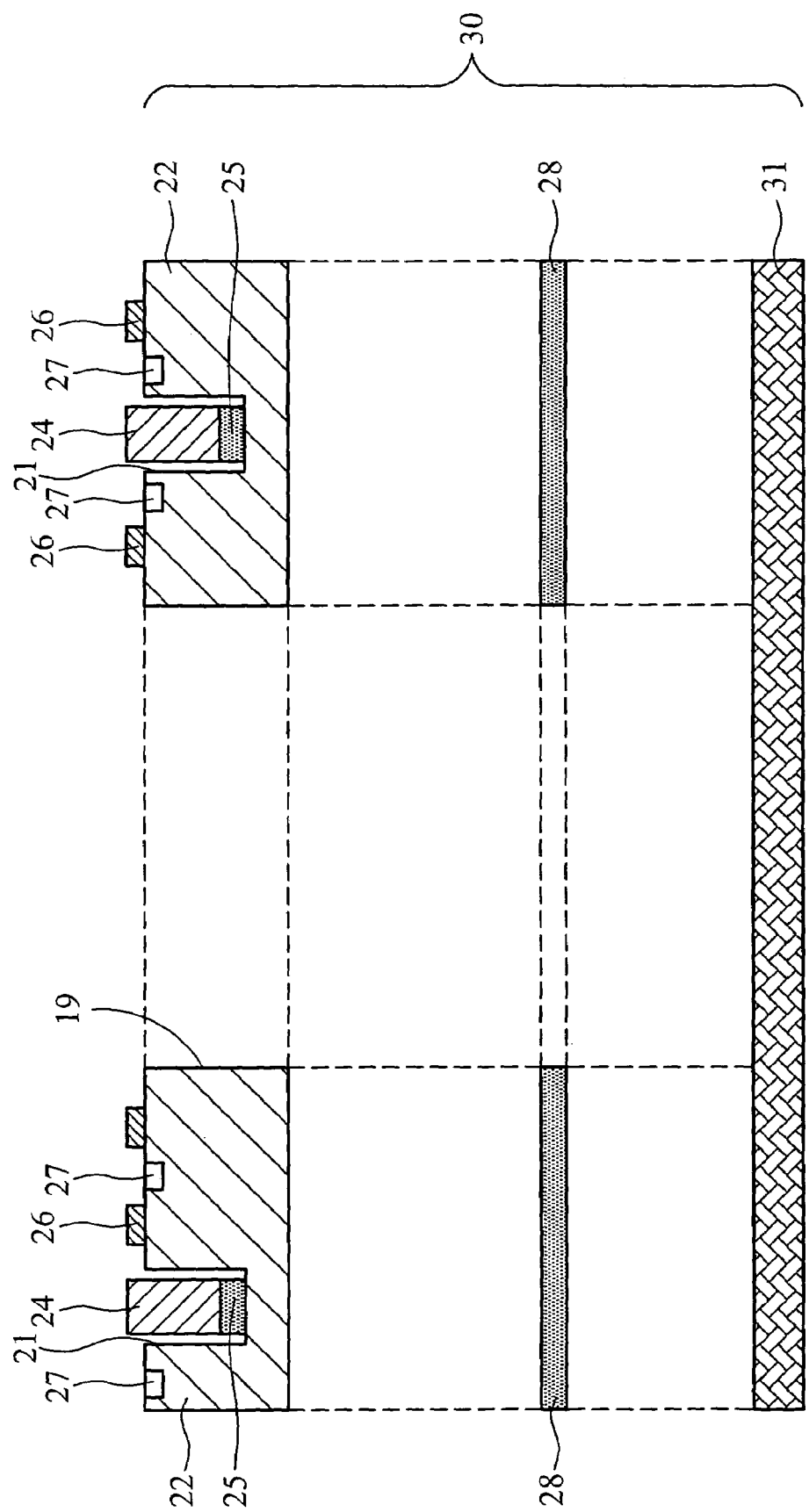
FIGS. 1 to 9 are sectional diagrams showing a method of forming the module board according to the present invention.

As shown in FIG. 1, a substrate 22, a first adhesion layer 28 and a heat-dissipation sheet 31 are provided to constitute a module board 30. The first adhesion layer 28 is employed to bond the heat-dissipation sheet 31 to the substrate 22, wherein the first adhesion layer 28 is preferred to be a conductive paste film. The heat-dissipation sheet 31 further provides EMI shielding effect, thus a metal sheet like copper (Cu) is preferred. The substrate 22 comprises a plurality of large cavities 19 for receiving IC chips and small cavities 21 for receiving passive components (such as resistors, capacitors and sensors). Depending on product designs and process requirements, the profile, size, and number of the large cavity 19 and the small cavity 21 can be appropriately modulated without any limitation. Also, a plurality of metal pads 26, alignment marks 27, and passive components 24 are fabricated on the substrate 22. In one preferred case, the passive components 24 are fixed in the small cavities 21, respectively, by an adhesion layer 25. In another preferred case, the passive components 24 are embedded into different layers of the substrate 22 using practical technologies. Moreover, the circuit route inside the substrate 22 can be designed to various types without detailed description in the figure.

Figure 2:
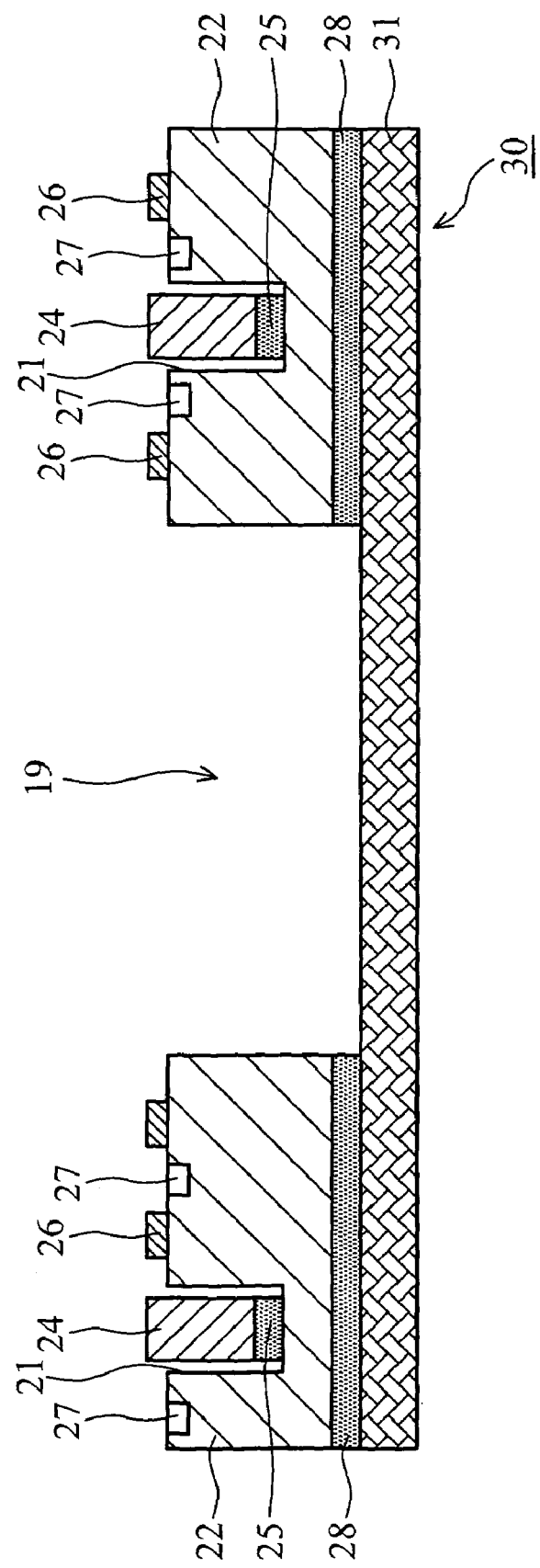

As shown in FIG. 2, using the first adhesion film 28, the heat-dissipation sheet 31 is bonded to the bottom of the substrate 22 to constitute the module board 30. Also, there remains the large cavities 19 to provide predetermined positions of IC chips.

Figure 3:
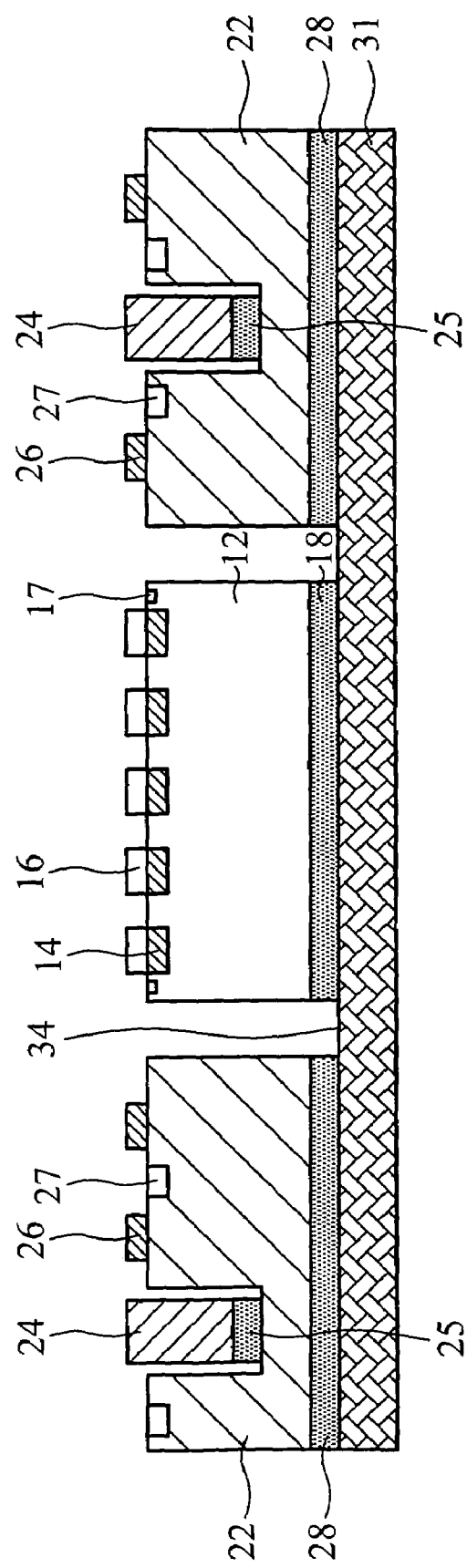

As shown in FIG. 3, at least one IC chip 12 is provided with a plurality of metal pads 14, electrical-test metal parts 16 and alignment marks 17 formed on the surface. Then, using a second adhesion layer 18, the bottom of the IC chip 12 is bonded to the module board 30 within the large cavity 19, and the gap between the IC chip 12 and the module board 30 serves as a trench 34. Preferably, the thickness of the IC chip 12 is approximately equal to the height of the substrate 22 to benefit subsequent processes. The second adhesion film 18 may be conventional adhesive tape, epoxy-based prepreg tape, thermal conductive film, adhesive film having conductive particles, or metal conductive paste.

Figure 4:
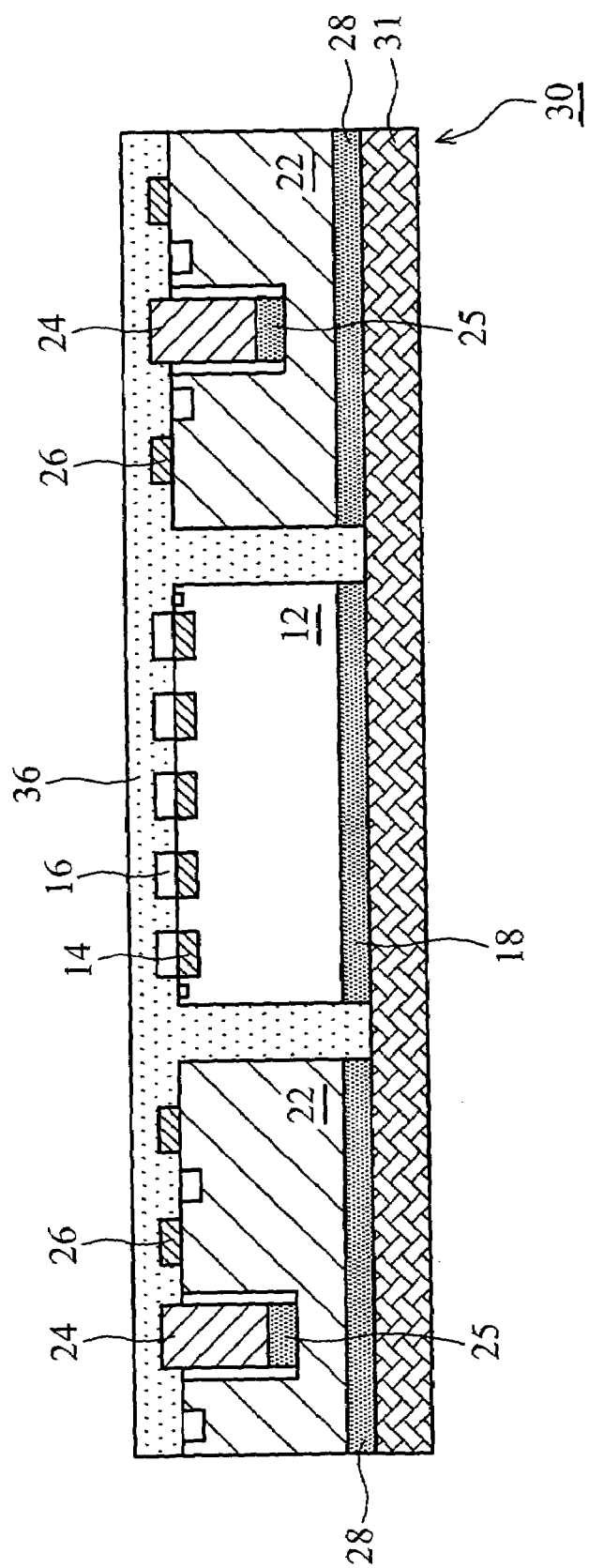

Next, a sealing process is performed to protect the IC chip 12 and passive components 24. As shown in FIG. 4, a dielectric filling layer 36 is deposited on the entire surface of the module board 30 to fill the trench 34 surrounding the IC chip 12 and other gaps surrounding the passive components 24. Preferably, the dielectric filling layer 36 comprises a polymer such as epoxy material and a dielectric material. In one case, the epoxy material flows into the trench 34 and gaps, and then the dielectric material is deposited on the entire surface of the module board 30. In another case, the epoxy material and the dielectric layer are provided on the entire surface of the module board 30 at the same time, such that the polymer such as epoxy material fills the trench 34 and gaps.

Figure 5:
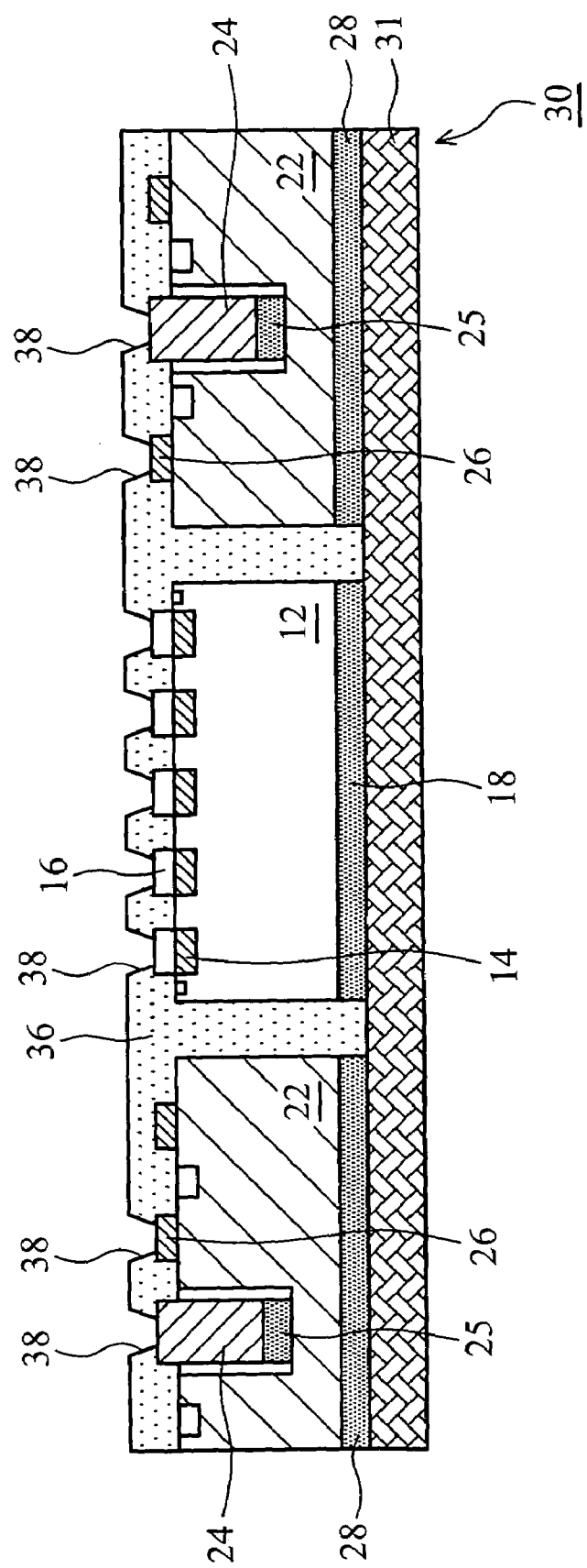
Figure 6:
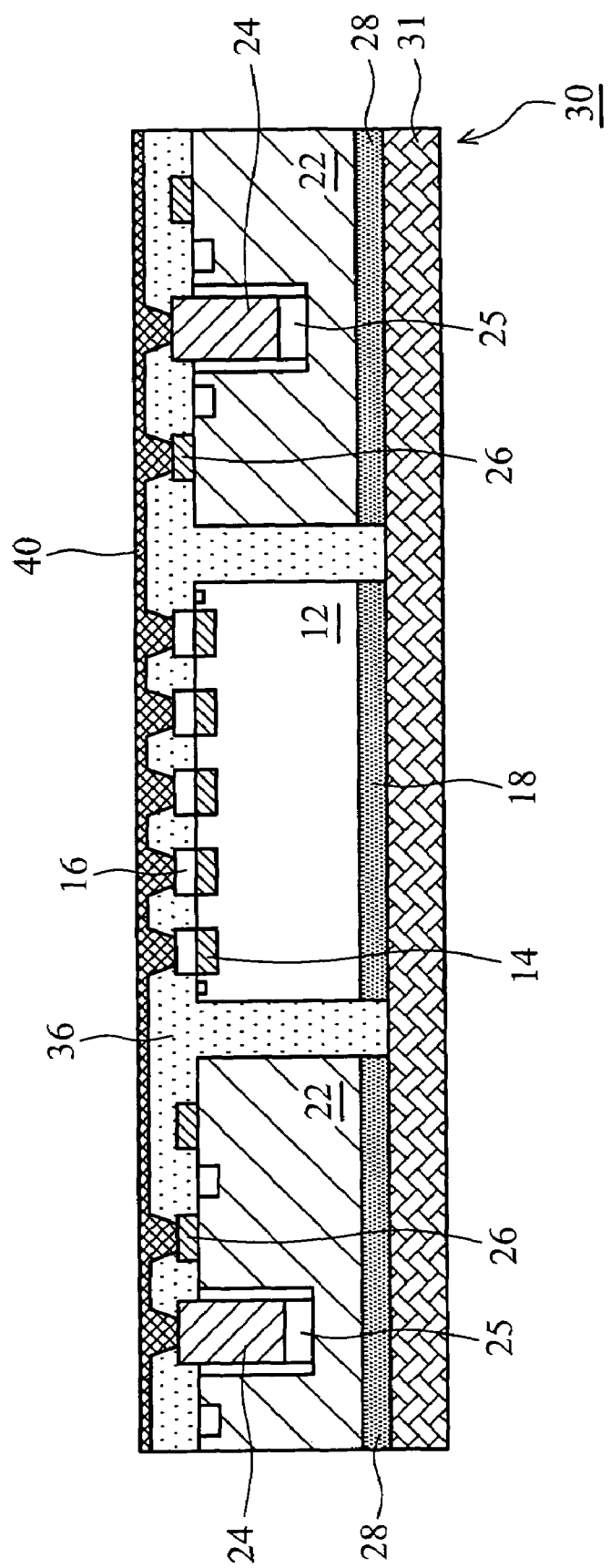
Figure 7:
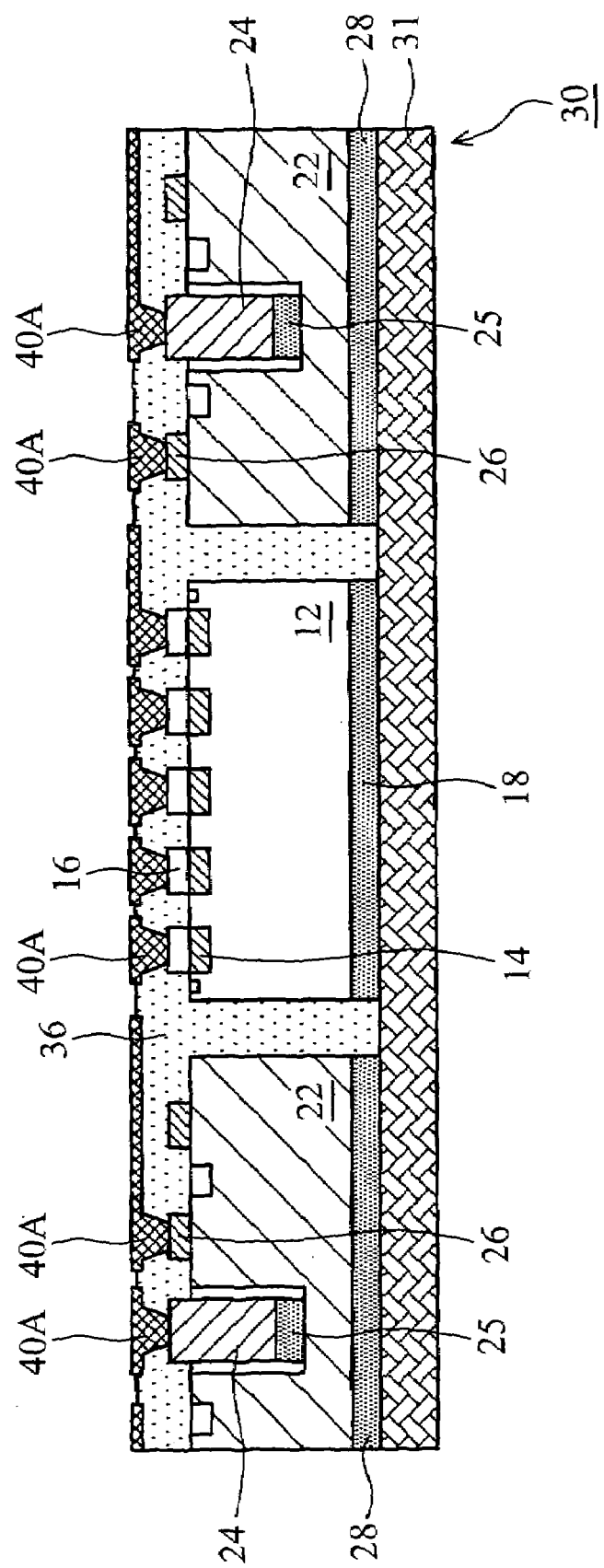

Next, a first interconnection process is performed to electrically connect the IC chip 12 and passive components 24 to the outside. As shown in FIG. 5, using laser drilling, plasma etching or photolithography, a plurality of micro vias 38 are formed in the dielectric filling layer 36 to expose the electrical-test metal parts 16, the metal pads 26 and passive components 24, respectively. Then, as shown in FIG. 6, using sputtering, vapor deposition, plating or printing, a first metal layer 40 is deposited on the entire surface of the module board 30 to fill the micro vias 38. Then, as shown in FIG. 7, using photolithography and etching or semi-additive process, the first metal layer 40 is patterned as a plurality of first metal wiring layers 40A.

Figure 8:
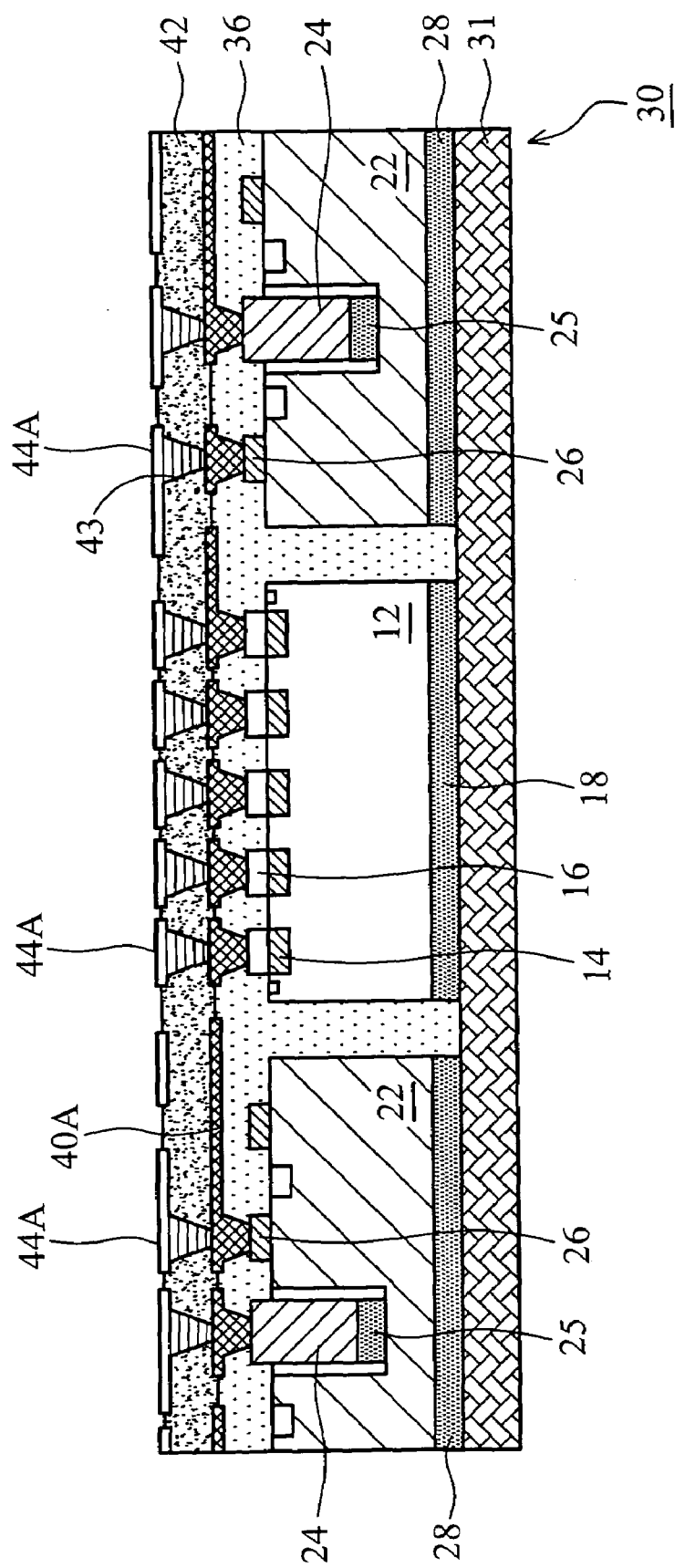

Next, a second interconnection process is performed to electrically connect the IC chip 12 and passive components 24 to outside. As shown in FIG. 8, in accordance with the aforementioned interconnection process, a dielectric layer 42, a plurality of micro vias 43 and a second metal layer are successively formed on the first metal wiring layers 40A. Then, using photolithography and etching or semi-additive process, the second metal layer is patterned as a plurality of second metal wiring layers 44A electrically connected to the first metal wiring layers 40A through the micro vias 43.

Depending on the design choice, the electrical connection between the second metal wiring layer 44A and other circuit boards in a cavity down manner may employ direct contact or solder balls or pins. In one case of using direct contact, a mask layer is provided to expose predetermined positions of the second metal wiring layers 44A to define the electrically connecting positions. In the other case of using solder balls, as shown in FIG. 9, a plurality of solder balls 48 are fabricated on the predetermined positions of electrical connection.

Figure 9:
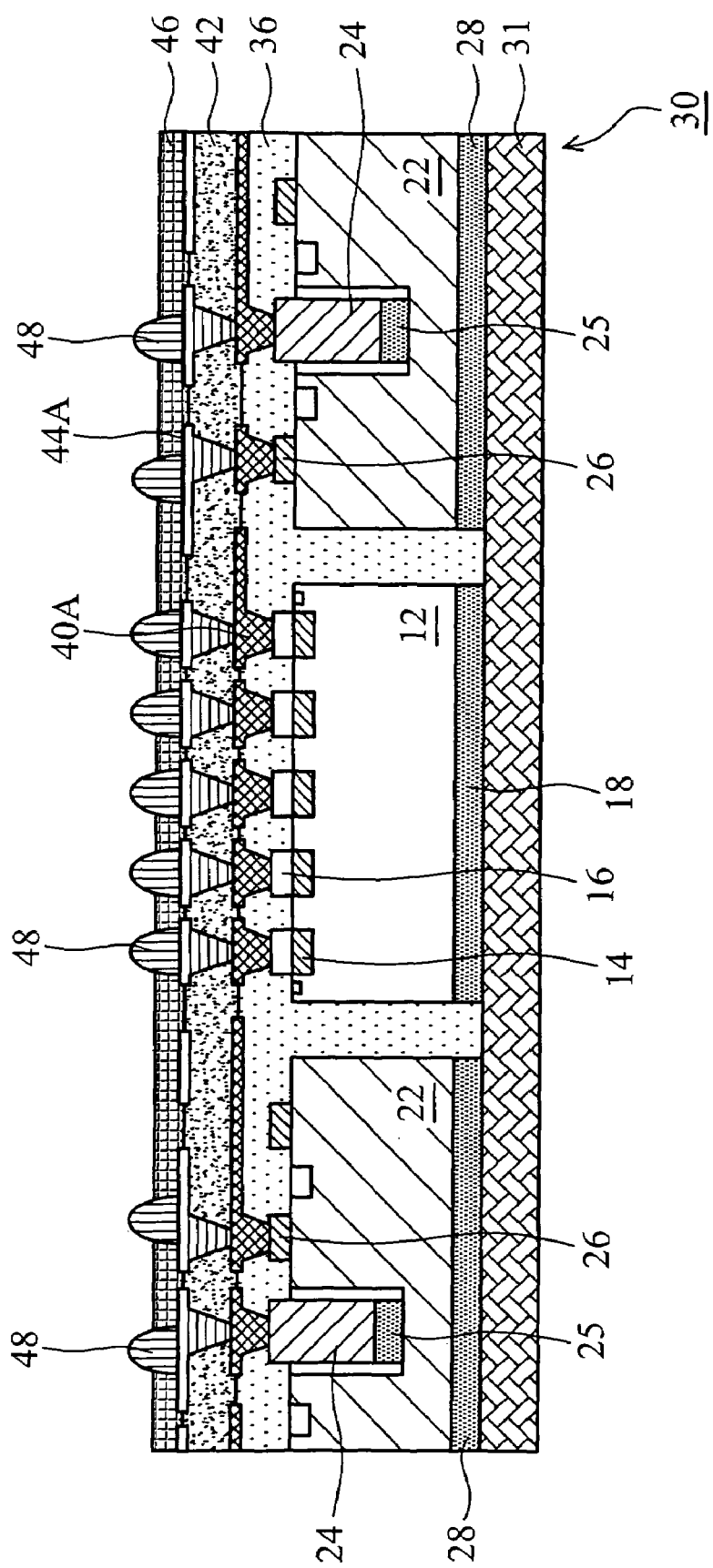

As shown in FIG. 9, using printing or photolithography/etching, a mask layer 46 is formed on the entire surface of the module board 30 to expose predetermined positions of the second metal wiring layers 44A. After coating a solder mask material on the predetermined positions, a plurality of solder balls 48 are placed on the predetermined positions, respectively. Finally, using reflowing, the solder ball 48 is fixed in the predetermined position. Thus, the solder ball 48 can electrically connect to other circuit boards in a cavity down manner. If the integrated module board is a system or sub-system one, then there will be no necessity to place solder balls or pins. The module board can use electrical conduction pads or opto-electronical connectors.

Figure 10:
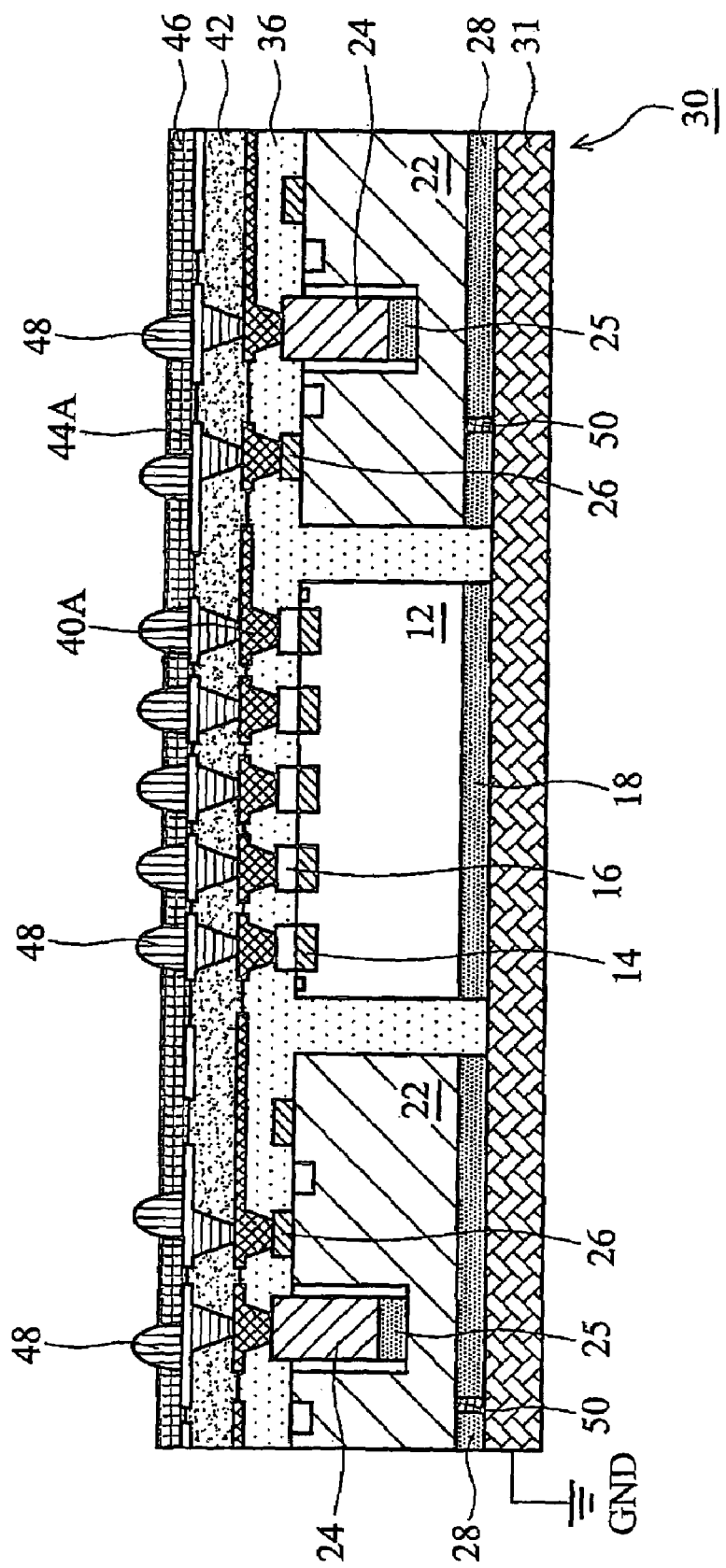
FIGS. 10 to 16 are sectional diagrams of the module board according to embodiments of the invention.

Furthermore, in embodiments of the invention, the substrate 22 can be further connected to the heat-dissipation sheet 31 through an electrical conduction part 50 in the first adhesion layer 28, as shown in FIG. 10, wherein the heat-dissipation sheet 31 is coupled to ground GND.

Figure 11:
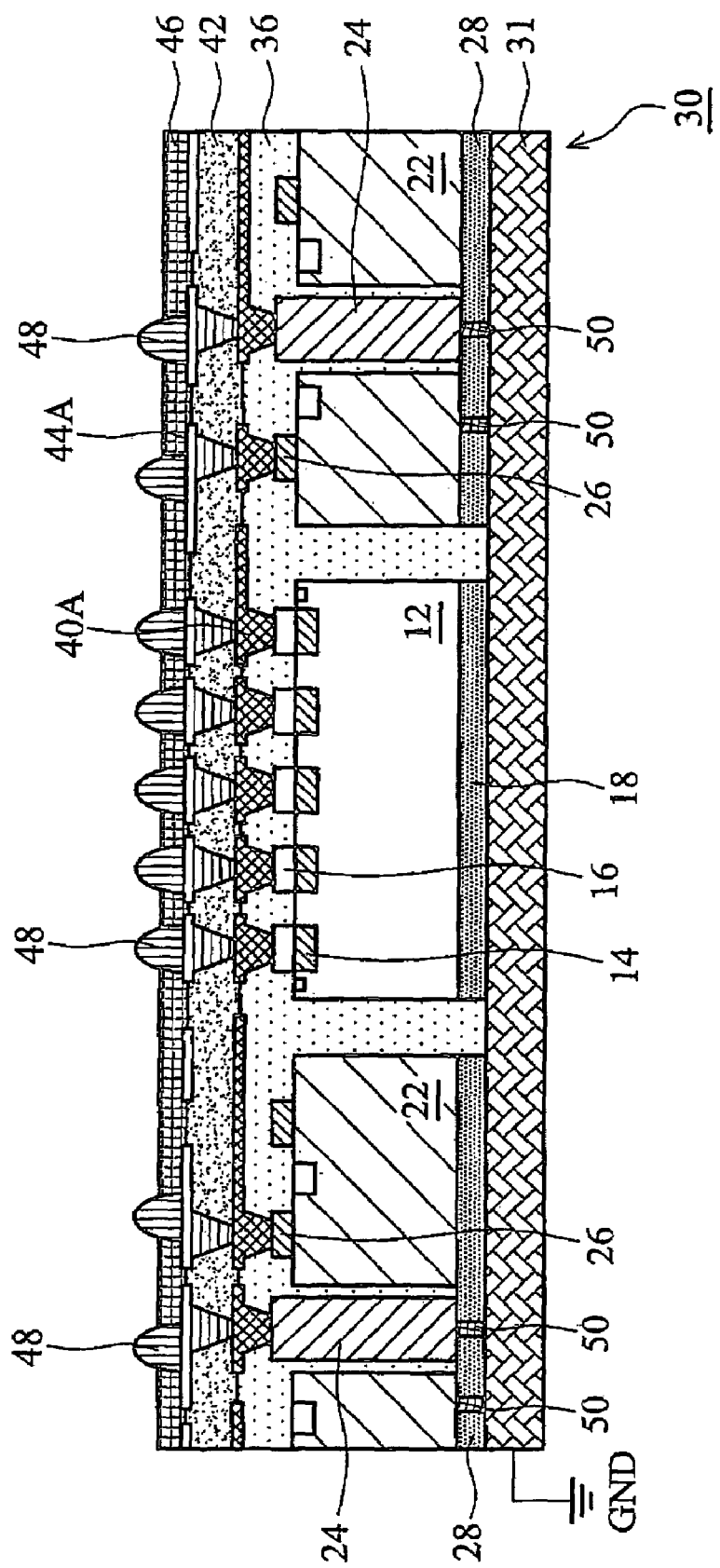

Referring to FIG. 11, the small cavity also can pass through the substrate, leading the passive component 24 bonded to the heat-dissipation sheet 31 via the first adhesion layer 28. The passive component 24 can be further connected to the heat-dissipation sheet 31 through an electrical conduction part 50 in the first adhesion layer 28, wherein the heat-dissipation sheet 31 is coupled to ground GND.

Figure 12:
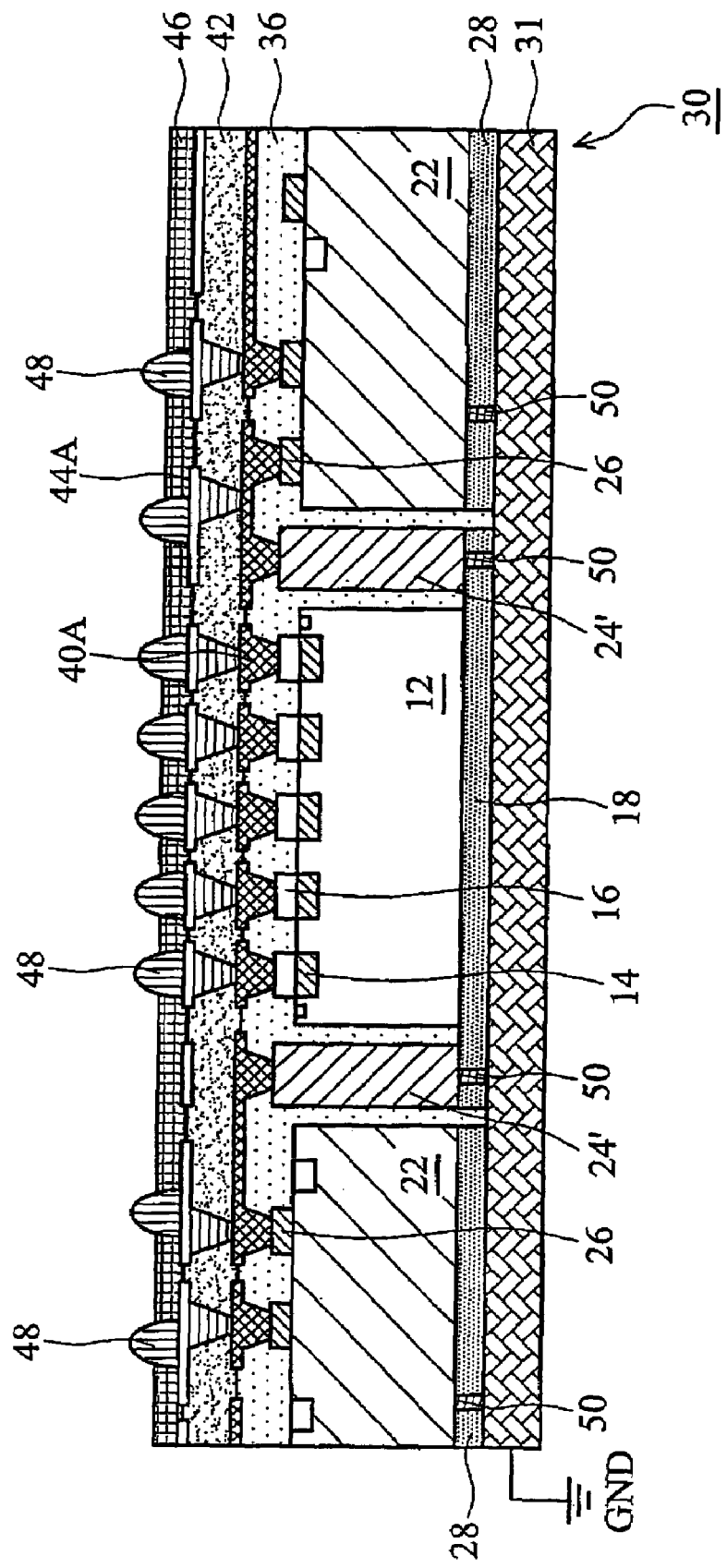

In embodiments of the invention, the module board 30 can further comprise additional passive components 24' set in the large cavity 19, and the additional passive components 24' can be adjacent to the IC chip 12, as shown in FIG. 12. The additional passive components 24' are bonded on the heat-dissipation sheet 31 by the second adhesion layer 18 and connected to the heat-dissipation sheet 31 through an electrical conduction part 50 in the second adhesion layer 18 to couple to ground GND.

Figure 13:
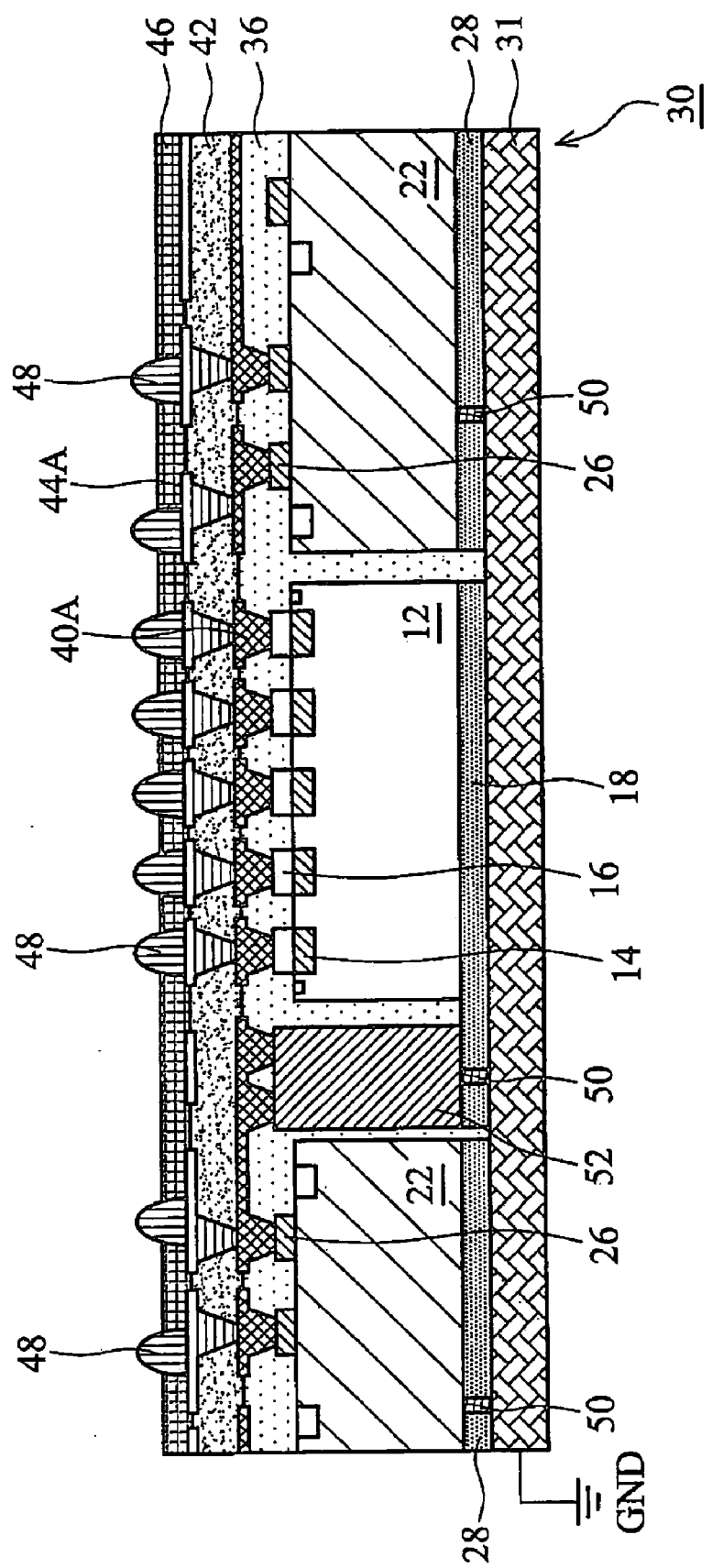

In embodiments of the invention, the module board 30 can also comprise an integrated passive component (or module) 52 set in the large cavity 19, and the integrated passive component (or module) 52 can be deposed in the small cavity or be adjacent to the IC chip 12, as shown in FIG. 13. The integrated passive component (or module) 52 are bonded on the heat-dissipation sheet 31 by the second adhesion layer 18 and connected to the heat-dissipation sheet 31 through an electrical conduction part 50 in the second adhesion layer 18 to couple to ground GND.

Figure 14:
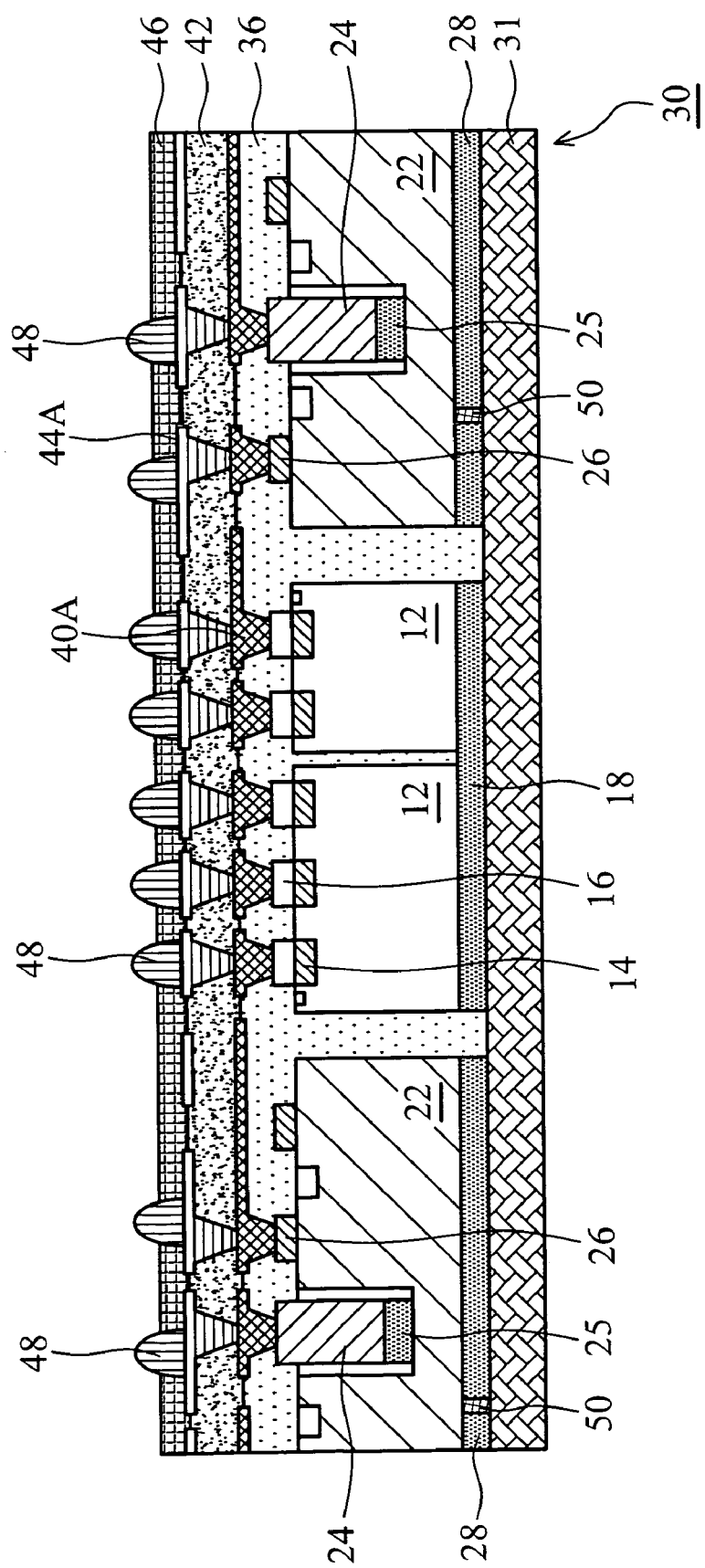
Figure 15:
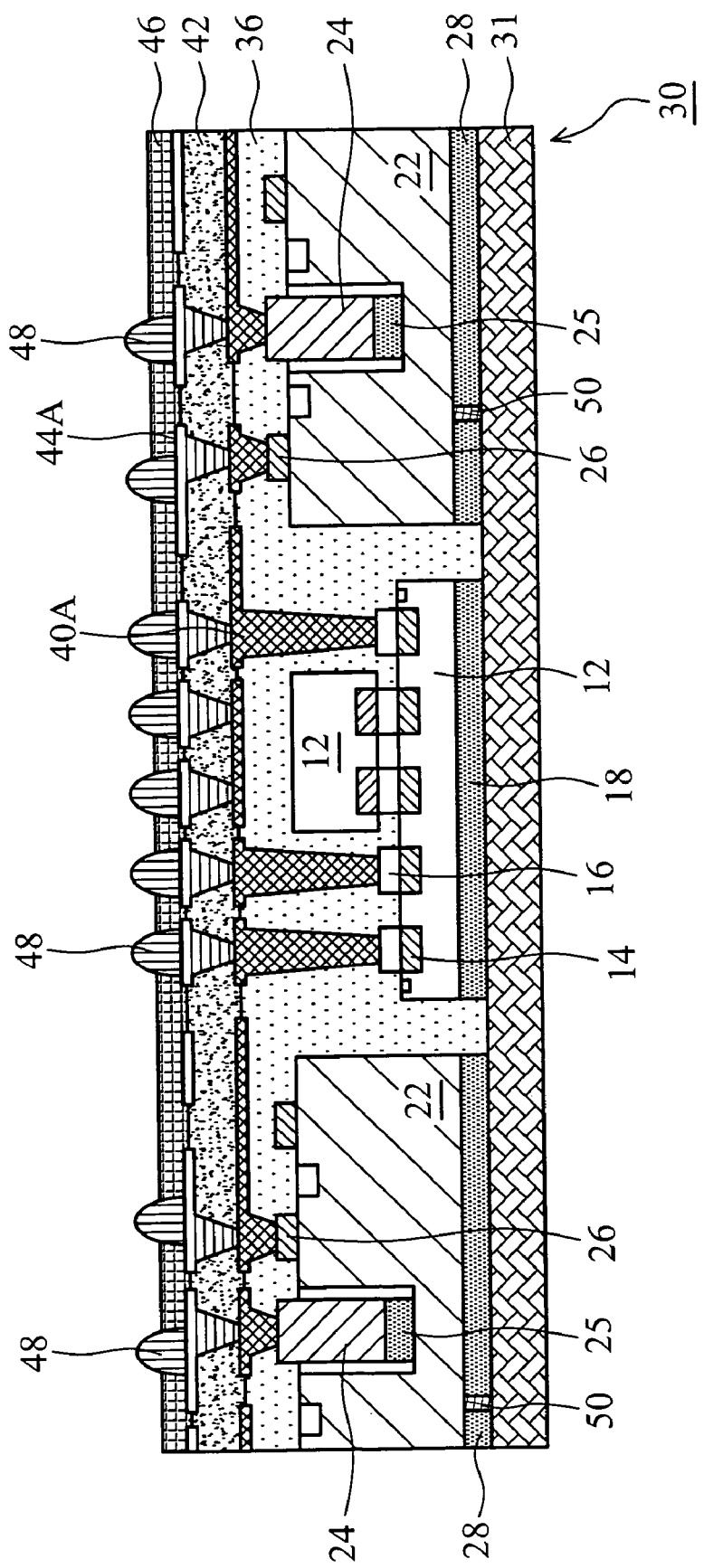
Figure 16:
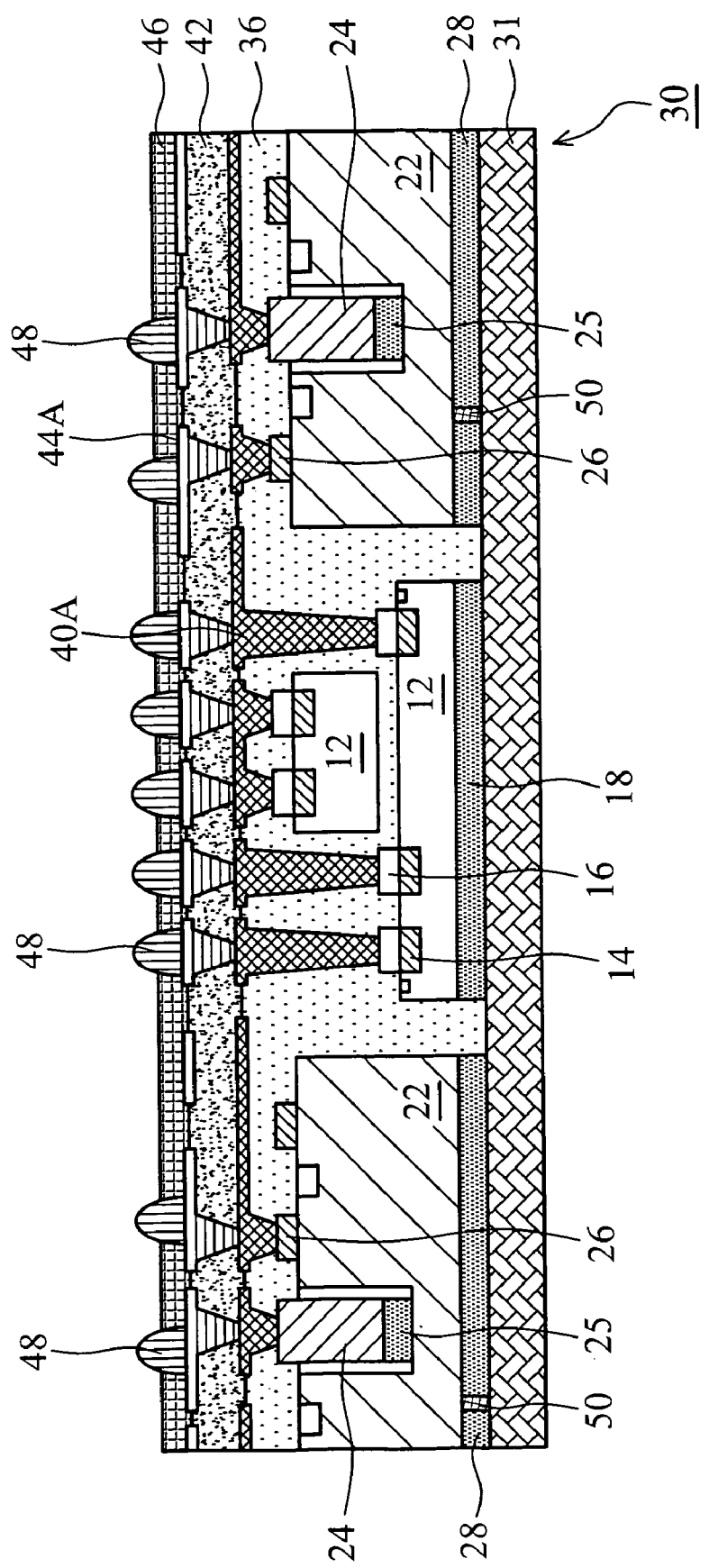

In embodiments of the invention, the module board 30 can comprise at least two Ic chips 12, fixed in the large cavity 19 of the substrate 22 by the second adhesion layer 18. The IC chips 12 can be disposed on the heat-dissipation sheet 31, as shown in FIG. 14. Furthermore, the at least two IC chips can be also fixed in the large cavity and stacked with each other, as shown in FIG. 15. According to embodiments of the invention, the stacked IC chips can be electrically connected to each other, as shown in FIG. 16.

The multi-chip module can include light emitting die or opto-electronical die, and there is cavity or wave guide (or the both) formed over the lighting surface of that to guide the light transmission. The wave guide can be any designed pattern built in the substrate and connected to the surface or other opto-electronical die.

The module board 30 constitutes the substrate 22 having cavities and heat-dissipation sheet 31 that adhere to each other. Also, the IC chip 12 and passive components 24 are embedded in the substrate 22, thus the multi-layered interconnection process can directly proceed on the module board 30 to omit the conventional steps including wiring, assembly of passive components and assembly of heat sinks/fans. Moreover, since the IC chip 12 and passive components 24 having different functions are integrated into the module board 30, the integrated module board 30 is viewed as a system integration package (SIP or SOP) and has advantages of reducing the size of the circuit board that is subsequently connected to the module board 30 and decreasing the assembly cost of the passive components 24.

Compared with the prior art, the module board 30 and the method of forming the same have advantages as follows. First, the IC chip 12 is directly fixed in the large cavity 19 and the passive components 24 are directly fixed in the small cavities 21, thus the modeling process is simplified and the process cost is decreased. Second, the electrical-test metal parts 16 on the IC chip 12 is electrically connected to the solder ball 48 through the first metal wiring layer 40A and the second metal wiring layer 44A, thus the electrical test is more convenient. Third, since the IC chip 12 and passive components 24 are embedded in the module board 30 during the same packaging level, it is possible to modulate the height of the chip 12 and components 24 to control the thickness of the module board 30, resulting in decreased dimensions of the product. Fourth, the transmission distance between the IC chip 12 and the passive component 24 becomes closer to improve the electrical property of the product. Fifth, the conventional steps including wiring, assembly of passive components and assembly of heat sinks/fans are omitted to increase the product yield and decrease the process costs. In addition, the module board 30 can be applied to a single-chip module product, a multi-chip module product, a sub-system circuit board, and a system main board.

It is to be understood that the present invention is not limited to the embodiments described above, but encompasses any and all embodiments within the scope of the following claims.

What is claimed is:

1. A module board having embedded chips and components, comprising:

a substrate having at least one large cavity and at least one small cavity, in which the large cavity passes through the substrate and at least one passive component is set in the small cavity;

a heat-dissipation sheet set at the bottom of the substrate;

a first adhesion layer which bonds the bottom of the substrate to the heat-dissipation sheet;

at least one IC chip fixed in the large cavity of the substrate by a second adhesion layer, wherein the IC chip comprises a plurality of metal pads formed on the surface of the IC chip, wherein a plurality of electrical-test metal parts formed on the metal pads, respectively;

a dielectric filling layer covering the entire surface of the substrate and filling all gaps at the surface of the substrate and in all of the cavities, wherein the dielectric filling layer has a plurality of micro vias to expose partial areas of the IC chip, the passive component and the substrate; and at least one wiring pattern layer formed on the dielectric filling layer to make the IC chip, the passive component and the substrate electrically connect.

2. The module board having embedded chips and components according to claim 1, further comprising an adhesion layer which bonds the passive component in the small cavity.

3. The module board having embedded chips and components according to claim 1, further comprising a plurality of solder balls, pins, electrical connection pads, or opto-electronic connectors placed on the wiring pattern layer.

4. The module board having embedded chips and components according to claim 1, wherein the dielectric filling layer comprises a polymer and a dielectric material.

5. The module board having embedded chips and components according to claim 1, further comprising an electrical conduction part passing through the first adhesion layer to connect the substrate with the heat-dissipation sheet, wherein the heat-dissipation sheet is coupled to ground.

6. The module board having embedded chips and components according to claim 1, wherein the small cavity passes through the substrate and the passive component set in the small cavity is connected to the heat-dissipation sheet through an electrical conduction part in the first adhesion layer to couple to ground.

7. The module board having embedded chips and components according to claim 1, further comprising at least one passive component, set in the large cavity, adjacent to the IC chip, wherein the passive component set in the large cavity is connected to the heat-dissipation sheet through an electrical conduction part in the first adhesion layer to couple to ground.

8. The module board having embedded chips and components according to claim 1, further comprising an integrated passive component, set in the large cavity, adjacent to the IC chip, wherein the integrated passive component set in the large cavity is connected to the heat-dissipation sheet through an electrical conduction part in the first adhesion layer to couple to ground.

9. The module board having embedded chips and components according to claim 1, wherein the at least one IC chip is a plurality of IC chips fixed in the large cavity and disposed on the heat-dissipation sheet.

10. The module board having embedded chips and components according to claim 1, wherein the at least one IC chip is a plurality of IC chips fixed in the large cavity and stacked each other.

11. The module board having embedded chips and components according to claim 10, wherein the IC chips are electrically connected each other.

12. A method of forming a module board having embedded chips and components, comprising steps of:

providing a substrate having at least one large cavity and at least one small cavity, in which the large cavity passes through the substrate and a passive component is set in the small cavity;

providing a heat-dissipation sheet;

providing a first adhesion layer to bond the bottom of the substrate to the heat-dissipation sheet;

providing at least one IC chip, wherein the IC chip comprises a plurality of metal pads formed on the surface of the IC chip, wherein a plurality of electrical-test metal parts formed on the metal pads, respectively;

providing a second adhesion layer to bond the bottom of the IC chip to the large cavity of the substrate;

forming a dielectric filling layer to cover the entire surface of the substrate and fill all gaps at the surface of the substrate and in all of the cavities;

forming a plurality of micro vias in the dielectric filling layer to expose partial areas of the IC chip, the passive component and the substrate; and forming at least one wiring pattern layer on the dielectric filling layer to provide electrical connection among the IC chip, the passive component and the substrate.

13. The method of forming a module board having embedded chips and components according to claim 12, wherein the passive component is fixed in the small cavity by an adhesion layer.

14. The method of forming a module board having embedded chips and components according to claim 12, further comprising a plurality of solder balls, pins, electrical connection pads, or opto-electronic connectors placed on the wiring pattern layer.

15. The method of forming a module board having embedded chips and components according to claim 12, wherein the step of forming the dielectric filling layer comprises:

proving a polymer to fill all gaps on the surface of the substrate and in all of the cavities; and forming a dielectric material to cover the entire surface of the substrate.

16. The method of forming a module board having embedded chips and components according to claim 12, wherein at the step of forming the dielectric filling layer, a polymer and a dielectric material are provided at the same time to fill all gaps on the surface of the substrate and in all of the cavities and cover the entire surface of the substrate.

17. The method of forming a module board having embedded chips and components according to claim 12, wherein the first adhesion layer comprises an electrical conduction part therethrough to connect the substrate with the heat-dissipation sheet, and the heat-dissipation sheet is coupled to ground.

18. The method of forming a module board having embedded chips and components according to claim 12, wherein the small cavity passes through the substrate and the passive component set in the small cavity is connected to the heat-dissipation sheet through an electrical conduction part in the first adhesion layer to couple to ground.

19. The method of forming a module board having embedded chips and components according to claim 12, further comprising providing at least one passive component set in the large cavity, adjacent to the IC chip, wherein the passive component set in the large cavity is connected to the heat-dissipation sheet through an electrical conduction part in the first adhesion layer to couple to ground.

20. The method of forming a module board having embedded chips and components according to claim 12, further comprising providing an integrated passive component set in the large cavity, adjacent to the IC chip, wherein the integrated passive component set in the large cavity is connected to the heat-dissipation sheet through an electrical conduction part in the first adhesion layer to couple to ground.

21. The method of forming a module board having embedded chips and components according to claim 12, wherein the at least one IC chip is a plurality of IC chips fixed in the large cavity and disposed on the heat-dissipation sheet.

22. The method of forming a module board having embedded chips and components according to claim 12, wherein the at least one IC chip is a plurality of IC chips fixed in the large cavity and stacked each other.

23. The method of forming a module board having embedded chips and components according to claim 22, wherein the IC chips are electrically connected each other.

* * * * *